(12) United States Patent
Wu et al.

(10) Patent No.: US 7,788,079 B2
(45) Date of Patent: Aug. 31, 2010

(54) METHODS FOR PRODUCING EQUIVALENT CIRCUIT MODELS OF MULTI-LAYER CIRCUITS AND APPARATUS USING THE SAME

(75) Inventors: Ke-Li Wu, Hong Kong (CN); Jie Wang, Hong Kong (CN)

(73) Assignee: Chinese University of Hong Kong, Hong Kong SAR (CN)

( * ) Notice: Subject to any disclaimer, the term of this patent is extended or adjusted under 35 U.S.C. 154(b) by 733 days.

(21) Appl. No.: 11/429,397

(22) Filed: May 5, 2006

(65) Prior Publication Data
US 2007/0168173 A1 Jul. 19, 2007

Related U.S. Application Data

(60) Provisional application No. 60/759,975, filed on Jan. 19, 2006.

(51) Int. Cl.
*G06F 17/50* (2006.01)
(52) U.S. Cl. .................. 703/14; 716/15; 716/18; 716/1; 716/4; 703/13; 703/15; 703/16; 703/17; 324/601; 324/207.14; 324/207.16; 326/95; 326/36
(58) Field of Classification Search ............. 703/13, 703/15; 361/793, 763; 716/5
See application file for complete search history.

(56) References Cited

U.S. PATENT DOCUMENTS

| | | | |
|---|---|---|---|
| 6,707,682 B2 * | 3/2004 | Akiba et al. ............... 361/763 |
| 7,325,208 B2 * | 1/2008 | Chakravarty et al. .......... 716/5 |
| 2002/0015293 A1 * | 2/2002 | Akiba et al. ................ 361/793 |
| 2004/0225485 A1 * | 11/2004 | Lowther et al. .............. 703/15 |
| 2006/0031055 A1 * | 2/2006 | Sheehan ..................... 703/14 |
| 2006/0074617 A1 * | 4/2006 | Chakravarty et al. ......... 703/13 |

OTHER PUBLICATIONS

Lawrence T. Pileggi, Altan Odabasioglu Prima: Passivie Reduced-Order Interconnect Macromodeling Algorith IEEE Transactions on Computer-Aided Design of Intergrated Circuits and Systems, vol. 17, No. 8, Aug. 1998.*

David Ling, I. M. Elfadel A block rational Arnoldi algorithm for multipoint passive model-order reduction of multiport RLC networks Computer-Aided Design, 1997. Digest of Technical Papers, 1997 IEEE/ACM International Conference.*

Roland W. Freund Reduced -Order Modeling Techniques Based in Krylov Subspaces and Their Use in Circuit Simulation Numerical Nanalysis Manuscript No. 98-3-02.*

(Continued)

*Primary Examiner*—Kamini S Shah
*Assistant Examiner*—Cuong V Luu
(74) *Attorney, Agent, or Firm*—Knobbe, Martens, Olson & Bear, LLP

(57) ABSTRACT

A method and an apparatus for obtaining an equivalent circuit model of a multi-layer circuit are disclosed. The method includes simulating the multi-layer circuit using an electromagnetic field analysis to provide a coupling network; and simplifying the coupling network using a circuit model order reduction method to generate the equivalent circuit model. The method is very simple to implement and the equivalent circuit model obtained has an apparent physical meaning.

24 Claims, 14 Drawing Sheets

OTHER PUBLICATIONS

Chirayu S. Amin, Masud H. Chowdhury, Yehea I. Ismail Realizable RLCK Circuit Crunching ACM 1-58113-688-0/03/0006, Jun. 2-6, 2003.*

Zhanhai Qin, Chung-Kuan Cheng RCLK-VJ Network Reduction With Hurwitz Polynomial Approximation 0-7803-7659-5/03, 2003 IEEE.*

Bandler et al., "Electromagnetic Optimization Exploiting Aggressive Space Mapping," IEE Transactions on Microwave Theory and Techniques, vol. 43. No. 12, Dec. 1995, pp. 2874-2882.

Wu et al., "An Effective Dynamic Coarse Model for Optimization Design of LTCC RF Circuits With Aggressive Space Mapping," IEE Transactions on Microwave Theory and Techniques, Vo., 52, No. 1, Jan. 2004, pp. 393-402.

Odabasioglu et al., "PRIMA: Passive Reduced-Order Interconnect Macromodeling Algorithm," IEE Transactions on Computer-Aided Design of Integrated Circuits and Systems, vol. 17, No. 8, Aug. 1998, pp. 645-654.

Heeb et al., "Three-Dimensional Interconnect Analysis Using Partial Element Equivalent Circuits," IEE Transactions on Circuits and Systems-1: Fundamental Theory and Applications, vol. 39, No. 11, Nov. 1992.

Albert E. Ruehli, "Equivalent Circuit Models for three-Dimensional Multiconductor System," IEEE Transactions on Microwave Theory and Techniques, vol. MTT-22, No. 3, Mar. 1974, pp. 216-221.

Timmins et al., "An Efficient Systematic Approach to Model Extraction for Passive Microwave Circuits," IEE Transactions of Microwave Theory and Techniques, vol. 48, No. 9, Sep. 2000, pp. 1565-1573.

Werner, et al., "Extraction of SPICE-Type Equivalent Circuits of Microwave Components and Discontinuities Using the Genetic Algorithm Optimization Techniques," IEEE Transactions on Advanced Packing, vol. 23, No. 1, Feb. 2000, pp. 55-61.

Rambabu, et al., "Simplified Analysis Technique for the Initial Design of LTCC Filters with All-Capacitive Coupling," IEEE Transactions on Microwave Theory and Techniques, vol. 53, No. 5, May 2005, pp. 1787-1791.

Sutono et al., "High-$Q$ LTCC-Based Passive Library for Wireless System-on-Package (SOP), Module Development," IEEE Transaction on Microwave Theory and Techniques, vol. 49, No. 10, Oct. 2001, pp. 1715-1724.

Wu et al., "An Efficient PEEC Algorithm for Modeling of LTCC RF Circuits with Finite Metal Strip Thickness," IEE Microwave and Wireless Components Letters, vol. 13, No. 9, Sep. 2003, pp. 390-392.

Lim et al., "RF-System-On-Package (SOP) for Wireless Communications," IEE Microwave Magaine, Mar. 2002, pp. 88-99.

* cited by examiner

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 8.05 | 8.05 | 8.05 | 8.05 | 8.05 | 8.05 | 8.06 | 8.07 | 8.08 | 8.10 | 8.10 | 8.10 | 8.20 | 8.20 | 8.26 | 8.69 |
| 12.63 | 12.63 | 12.64 | 12.65 | 12.68 | 12.72 | 12.72 | 12.78 | 12.83 | 12.95 | 12.96 | 13.15 | 13.15 | 13.69 | 16.49 | |
| 19.31 | 19.31 | 19.43 | 19.45 | 19.54 | 19.55 | 19.66 | 19.75 | 19.79 | 19.80 | 20.20 | 20.74 | 20.74 | 23.83 | | |
| 25.25 | 25.34 | 25.46 | 25.47 | 25.62 | 25.64 | 25.67 | 25.67 | 25.92 | 26.25 | 27.67 | 28.33 | 28.33 | | | |
| 31.15 | 31.20 | 31.27 | 31.35 | 31.65 | 32.07 | 32.55 | 32.90 | 32.91 | 34.43 | 35.28 | 37.53 | 37.53 | | | |
| 34.60 | 34.64 | 34.84 | 35.14 | 35.14 | 35.77 | 36.04 | 36.75 | 37.32 | 37.34 | 38.08 | | | | | |
| 40.54 | 40.59 | 40.66 | 40.80 | 40.85 | 40.87 | 41.78 | 42.94 | 44.58 | 45.17 | | | | | | |
| 45.61 | 45.71 | 45.72 | 46.08 | 46.28 | 46.57 | 47.50 | 47.60 | 48.16 | | | | | | | |
| 49.27 | 49.52 | 49.56 | 50.37 | 51.27 | 51.91 | 52.01 | 52.46 | | | | | | | | |
| 52.26 | 52.92 | 53.12 | 53.82 | 55.51 | 56.30 | 56.34 | | | | | | | | | |
| 54.81 | 55.42 | 56.21 | 56.35 | 56.64 | 59.08 | | | | | | | | | | |
| 58.29 | 58.29 | 58.32 | 59.60 | 61.21 | | | | | | | | | | | |
| 61.13 | 61.23 | 61.25 | 63.09 | | | | | | | | | | | | |
| 63.84 | 65.00 | 65.01 | | | | | | | | | | | | | |
| 65.03 | 67.53 | | | | | | | | | | | | | | |
| 71.38 | | | | | | | | | | | | | | | |

Fig. 18

METHODS FOR PRODUCING EQUIVALENT CIRCUIT MODELS OF MULTI-LAYER CIRCUITS AND APPARATUS USING THE SAME

CROSS REFERENCE OF THE RELATED APPLICATION

This application claims the benefit of U.S. provisional patent application No. 60/759,975 filed Jan. 19, 2006 which is explicitly incorporated herein by reference in its entirety.

BACKGROUND OF THE INVENTION

1. Technical Field of the Invention

This invention relates to a method and an apparatus for converting a multi-layer circuit into an equivalent circuit model.

2. Description of Related Art

With the fast development of low loss and high density integrated packaging technologies such as low temperature co-fired ceramic (LTCC), a system on package (SoP) is considered as one of the most promising solutions for integrated electronic systems and hand-held wireless products. In designing an advanced SoP, one of the desired CAD tools is an algorithm that can systematically generate a physically meaningful circuit model for complex multi-layer circuits and interconnections.

Such a tool is mainly needed in: (1) a co-simulation of a mixed-signal heterogeneous system that includes digital circuits, which are usually modeled by a circuit simulator in time domain, and analog passive circuits, which are simulated by an electromagnetic (EM) simulation in frequency domain; and (2) the prediction of an electromagnetic interference (EMI) among multi-layer circuits.

Although tremendous work has been done in EM modeling and the extraction of a circuit representation of an embedded passive at GHz frequencies, circuit models resulted therefrom are limited to a predefined layout or the complexity of the circuit models is still overwhelming even with certain model simplification.

Obviously, it is highly desirable to develop a systematic technique that can directly convert a generic layout of a multi-layer circuit to a concise circuit model that is valid in a given range of frequency. Preferably, the circuit model possesses a clear physical meaning associated with a physical layout.

A number of techniques for extracting a lumped element equivalent circuit model for multi-layer circuit have been developed in the past years. The most popular technique is to construct an equivalent circuit model based on a predefined circuit topology from physical intuition. The component values of the circuit model can be determined by empirical formulas or by curve fitting. However, due to the lack of good understanding of the parasitic coupling mechanism for complex passive layouts, such a circuit model could not be too sophisticated and unique.

It is well known that a partial element equivalent circuit (PEEC) model is evolved from a mixed potential integral equation (MPIE). Although the PEEC model, which is also named as a coupling network in this invention, can be regarded as a primitive equivalent circuit, the number of the circuit elements is excessive to handle for practical cases and the capacitors and inductors in the model are only associated with a computational mesh structure.

The references cited herein are explicitly incorporated by reference in its entirety.

SUMMARY OF THE INVENTION

The present invention generally relates to a method and an apparatus for converting a multi-layer circuit into an equivalent circuit model based on an electromagnetic field analysis and a simple network transformation. The method of the invention also referred to herein as a derived physically expressive circuit modeling (DPECM) is very simple to implement and the equivalent circuit model obtained therefrom has an apparent physical meaning.

One aspect of the present invention is to provide a method which comprises simulating the multi-layer circuit using an electromagnetic field analysis to provide a coupling network; and simplifying the coupling network using a circuit model order reduction method to generate the equivalent circuit model.

According to another aspect of the present invention, an apparatus for converting a multi-layer circuit into an equivalent circuit model is provided, which comprises means for simulating the multi-layer circuit using an electromagnetic field analysis to provide a coupling network; and means for simplifying the coupling network using a circuit model order reduction method to generate the equivalent circuit model. Moreover, the means for simplifying the coupling network may be implemented by a software or a hardware such as an integrated circuit.

According to a further aspect of the present invention, an apparatus for converting a multi-layer circuit into an equivalent circuit model is provided which comprises a converter for converting a multi-layer circuit into a coupling network by using an electromagnetic field analysis; a memory for storing topology information representing the coupling network; and a processor for simplifying the coupling network based on the topology information to generate the equivalent circuit model.

In an embodiment of the present invention, the electromagnetic field analysis includes a PEEC modeling.

According to another embodiment of the present invention, the simplifying comprises determining whether or not a removable internal node exists among internal nodes in the coupling network based on a predetermined cut-off value; transforming, if there is a removable internal node, the removable internal node by using a Y-circuit to Δ-circuit transformation; approximating the Δ-circuit; and repeating the transforming and the approximating until there is no removable internal node existing among remaining internal nodes in the coupling network.

In another embodiment of the present invention, the determining comprises providing a reference value of each of the internal nodes based on topology information thereof; comparing the smallest reference value to the predetermined cut-off value; and determining the removable internal node is an internal node having the smallest reference value less than the predetermined cut-off value.

In the present invention, the multi-layer circuit may comprise a multi-layer embedded RF passive, or a circuit layout, and the multi-layer embedded RF passive may comprise a spiral inductor, a multi-layer capacitor, a multi-layer high-pass filter, or a multi-layer band-pass filter.

The method according to the present invention starts with generating a coupling network from an electromagnetic model such as a PEEC model, followed by combining and deducting operations of a "Y-circuit" to "Δ-circuit" transformation on all nodes of the coupling network one by one as shown in FIGS. 2a and 2b.

According to the method of the present invention, each removable internal node in a coupling network is deleted by first absorbing its fundamental attribute that is associated to its neighboring nodes and then omitting its minor attribute, which usually contributes only to the high frequency response.

Physically, the remaining internal nodes and the associated LC components in the resultant circuit will dominate the main property of the original coupling network and will present a clear physical meaning. Mathematically, the procedure is a model order reduction (MOR) scheme. This is because each node combination and deduction operation performs a function of combining the effect of the least important poles with that of other less important poles of the original coupling network. This property will be illustrated in the below description.

Thanks to its clear physical meaning, the circuit model derived by the method according to the present invention has been successfully applied to optimization designs of various LTCC embedded RF circuits and signal integrity analysis.

BRIEF DESCRIPTION OF THE DRAWINGS

FIG. 1b is a coupling network of the PEEC model of FIG. 1a;

FIG. 3a shows an equivalent circuit for $g_i$ of Y-circuit as shown in FIG. 2a;

FIG. 18 is a table illustrating system poles of Y-matrix for the spiral inductor as shown in FIG. 4.

DETAILED DESCRIPTION OF THE INVENTION

The present invention and various advantages thereof will be described with reference to exemplary embodiments in conjunction with the drawings.

Prior to describing embodiments of the invention, the principle of the PEEC modeling is now explained.

The PEEC algorithm was originally developed by Ruehli for modeling three-dimensional multi-conductor systems based on an integral equation description of the geometry that is interpreted in terms of circuit elements. In general, the circuit elements are frequency dependent whereas the circuit topology can be fixed over a broad band of frequency. In addition, the conductor loss and dielectric loss can also be taken into account.

The two major equations for building a coupling network of the PEEC model are:

$$Lp_{mn} = \frac{\mu}{4\pi} \frac{1}{l_m l_n} \int \int G_A(\vec{r}, \vec{r}')dsds' \qquad (1)$$

$$ps_{ij} = \frac{1}{4\pi\varepsilon} \frac{1}{s_i s_j} \int \int G_\phi(\vec{r}, \vec{r}')dsds' \qquad (2)$$

where $l_m, l_n$ are respectively the length of inductive elements m and n in the coupling network, $S_i$, $S_j$ are respectively the area of capacitive elements i and j in the coupling network, Lp,ps are a partial inductance and a coefficient of the potential of the coupling network respectively.

Notice that the integrals in the above equations are surface integrals for an infinite thin conducting strip model. A PEEC model concerning multi-layer RF circuits with a finite metal thickness can also be dealt with. The static Green functions $G_A, G_\phi$ can be expressed in a series form as the kernel for the integrals if the quasi-static condition can be applied.

Figure 1A:
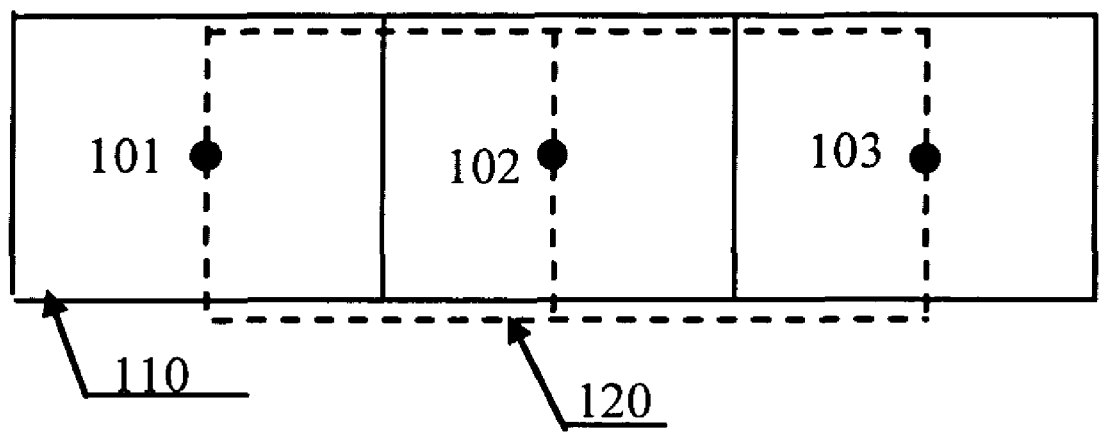
FIG. 1a shows inductive and capacitive meshes of a PEEC model in the prior art.

As an example of the PEEC modeling, FIG. 1a shows a group of typical computational mesh elements used in a PEEC model for modeling a short section of an infinitely thin straight conducting strip, in which the capacitive meshes 110 are represented by solid lines and the inductive meshes 120 are represented by dashed lines, and the coupling network comprises an internal node 102, a ground node (not shown) and two external ports 101 and 103.

Figure 1B:
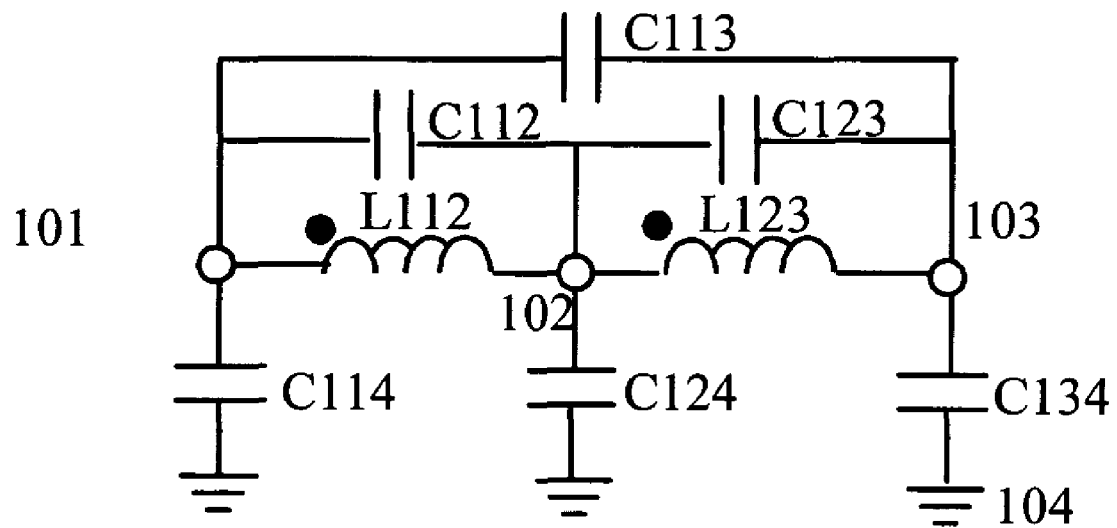

FIG. 1b shows a corresponding PEEC coupling network of the strip. It is seen that the capacitive meshes 110 can be represented as nodes and the inductive mesh 120 is represented by an inductor between two nodes in the corresponding circuit. Once the meshes are generated and the nodes are identified, Equations (1) and (2) are then applied to each pair of infinite thin inductive and capacitive meshes, respectively, to calculate the partial mutual inductance and coupling capacitance.

Figure 2A:
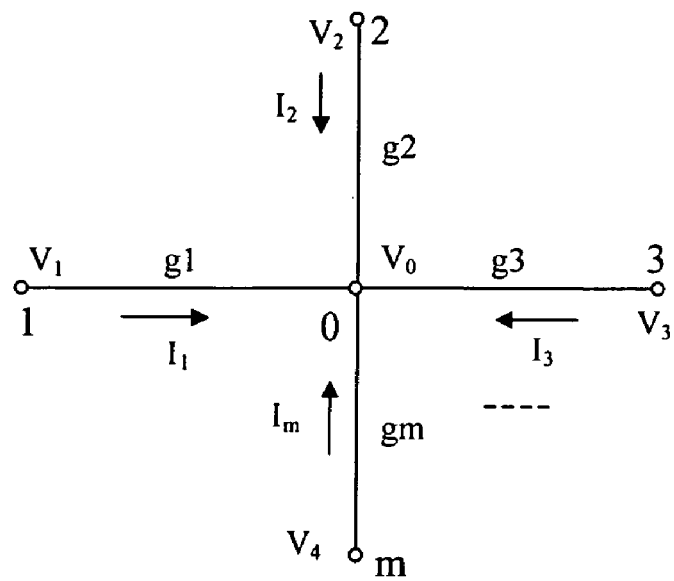
FIG. 2a shows a Y-circuit before node 0 is deleted.

According to the embodiment of the invention, once a general PEEC model converts an original 3-D multi-layer embedded passive into a coupling network, one of ordinary skill can obtain topology information (electric behavior) thereof by simulating the network using a circuit simulator. The topology information includes topology characteristic data and component values of the coupling network. With the topology information, it is possible to simplify the coupling network using a circuit model order reduction method so as to generate a simple equivalent circuit model. According to the present embodiment, a model order reduction method is employed to simplify the coupling network. Moreover, a nodal voltage method for analyzing the network will serve as the starting point of the model order reduction method to be presented in the invention. As shown in FIGS. 1-3, the coupling network comprises internal nodes, external nodes including external ports and a ground port, and coupling topology between these nodes. The number of the internal nodes and the external nodes is represented as $N_{in}$ and $N_{port}$, respectively, the coupling network comprises $N_{port}+N_{in}$ nodes. The coupling topology is represented by either a shunt circuit of a capacitor $C_i$ and an inductor $L_i$ or a capacitor $C_i$ between each pair of nodes as shown in FIG. 3a. If conductor loss is taken into account, the inductor can be represented by a frequency dependent complex number; the other losses, such as dielectric loss, radiation loss and surface wave loss can be expressed by a frequency dependent complex number. Physically, a complex inductance could be interpreted as a real inductor in series with a frequency dependent resistor, whereas a complex capacitance could be illustrated by a capacitor in shunt with a frequency dependant conductance.

According to the present invention, in order to simplify the coupling network, first we should determine whether or not a removable internal node exists among the internal nodes in the coupling network, if there is a removable internal node then transform the removable internal node by using Y-circuit to Δ-circuit transformation and approximating the Δ-circuit. The above procedures are repeated until there is no removable internal node existing in the remaining coupling network. Then the remaining coupling network is the simple equivalent circuit.

The method for determine whether or not a removable internal node exists will be described later. Here, we first describe how to simplify the coupling network if a removable internal node (e.g., node 0 as shown in FIG. 2a) exists.

The nodal voltage equation of the coupling network can be expressed as follows:

$$\begin{bmatrix} Y_{11} & Y_{12} \\ Y_{21} & Y_{22} \end{bmatrix} \begin{bmatrix} V_{in} \\ V_{port} \end{bmatrix} = \begin{bmatrix} 0 \\ I \end{bmatrix} \quad (3)$$

By the definition of admittance matrix associated with external ports, Y-parameters associated to the external ports can be found by:

$$Y = Y_{22} - Y_{21} Y_{11}^{-1} Y_{12} \quad (4)$$

The circuit transformation from a Y-circuit to a Δ-circuit can be best illustrated by the following mathematic derivation. As shown in FIG. 2a, a Y-circuit comprises a node 0 and a plurality of nodes coupling to the node 0 that is to be deleted are connected to node i (i=1, 2, ..., m) through admittance $g_i$, which is a function of frequency and represents electric properties of a small section of a multi-layer circuit.

Assume the voltage at node i is $V_i$ and the current in branch j is $I_j$, the following equations can be achieved by the circuit theory:

$$\begin{cases} I_1 = g_1(V_1 - V_0) \\ I_2 = g_2(V_2 - V_0) \\ \quad \cdots \\ I_m = g_m(V_m - V_0) \end{cases} \quad (5)$$

Since $$I_1 + I_2 + \cdots + I_m = 0$$

there is $$V_0 = \frac{g_1}{g_i} V_1 + \frac{g_2}{g_i} V_2 + \cdots + \frac{g_m}{g_i} V_m \quad (6)$$

where $$g_i = g_1 + g_2 + \cdots g_m$$

Substituting (6) into (5), we have $$\begin{cases} I_1 = \frac{g_1 g_2}{g_i}(V_1 - V_2) + \frac{g_1 g_2}{g_i}(V_1 - V_3) + \cdots + \frac{g_1 g_m}{g_i}(V_1 - V_m) \\ I_2 = \frac{g_2 g_1}{g_i}(V_2 - V_1) + \frac{g_2 g_3}{g_i}(V_2 - V_3) + \cdots + \frac{g_2 g_m}{g_i}(V_2 - V_m) \\ \vdots \\ I_m = \frac{g_m g_1}{g_i}(V_m - V_1) + \frac{g_m g_2}{g_i}(V_m - V_2) + \cdots + \frac{g_m g_{m-1}}{g_i}(V_m - V_{m-1}) \end{cases} \quad (7)$$

Figure 2B:
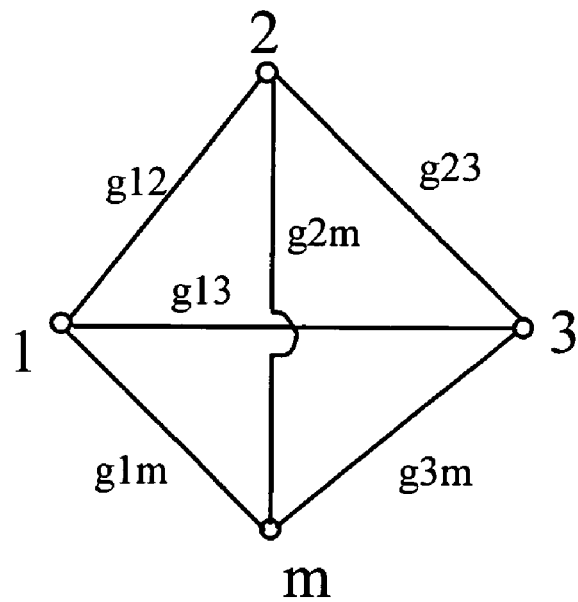
FIG. 2b shows a Δ-circuit after node 0 is deleted.
Figure 3A:
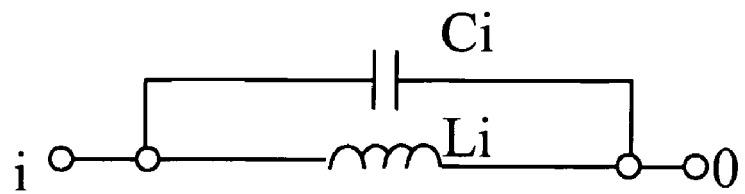

Equation (7) states that the Y-circuit is converted to a Δ-circuit shown in FIG. 2b after node 0 is deleted. The value $g_{ij}$ in FIG. 2b can be expressed as:

$$g_{ij} = \frac{g_i g_j}{g_i} \quad (8)$$

Since $g_i$ (i=1, 2, ... m) is frequency-dependent, $g_{ij}$ will be a function of frequency. Nevertheless, all of the nodes except the port nodes and ground nodes can be removed by this procedure node by node. It is worthy mentioning that although this node deduction procedure is frequency dependent, it is still about 10 times faster than evaluating (4) directly.

Because the above-mentioned model order reduction method is frequency dependent, the procedure must be repeated for every frequency sampling over a frequency range of interest. The fact suggests that if one can convert the coupling network into a simpler circuit model by removing most of the internal nodes frequency independently with an acceptable approximation, not only does the order reduction not need to be repeated for other frequencies, but also the resultant circuit model may involve certain physical meanings. To achieve the objective, a frequency-independent model order reduction method is hereby discussed as follows.

We start with investigating the expression of $g_{ij}$ in Equation (8). Generally, as shown in FIG. 3a, $g_i$ can be expressed as:

$$g_i = j\varpi C_i + \frac{1}{j\varpi L_i} \quad (9)$$

The admittance $g_i$ can be expressed by Equation (9) essentially because only the capacitor, the inductor and a combination thereof are to be considered here. Thus we can express $g_{ij}$ as a function of frequency:

$$g_{ij} = \frac{(j\varpi C_i + 1/j\varpi L_i)(j\varpi C_j + 1/j\varpi L_j)}{j\varpi C_i + 1/j\varpi L_i} \quad (10)$$

which can be further simplified as:

$$g_{ij} = j\varpi C_e + \frac{1}{j\varpi L_e} + \frac{1}{j\varpi L'_e + 1/j\varpi C'_e} \quad (11)$$

where $$C_e = \frac{C_i C_j}{C_i} \quad L_e = \frac{L_i L_j}{L_i} \quad L'_e = \frac{C_i}{\alpha} \quad C'_e = L_i \alpha$$

$$\alpha = \frac{C_i}{L_j} + \frac{C_j}{L_i} - \frac{C_i C_j}{L_i C_i} - \frac{L_i C_i}{L_i L_j} \quad (12)$$

$L_t, C_t$ are the total inductance and capacitance connected to a node to be deleted, respectively. Obviously, $g_{ij}$ can be interpreted by an equivalent circuit as shown in FIG. (3). As stated above, for the removable node 0, the Y-circuit is transformed to a Δ-circuit without any approximation. Next, some approximation of the Δ-circuit is implemented to derive frequency independent circuit mode.

Figure 3B:
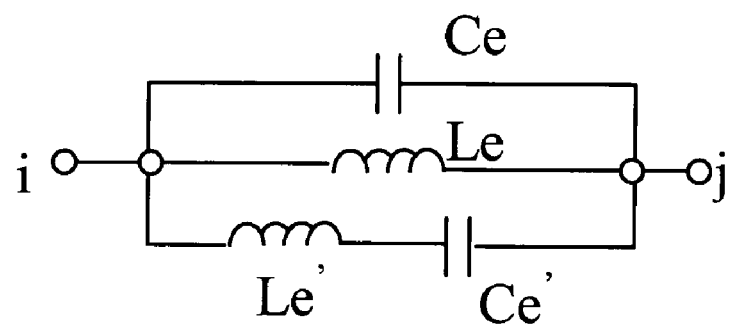
FIG. 3b shows an equivalent circuit for $g_{ij}$ of Δ-circuit as shown in FIG. 2B.

Each component in this circuit is frequency-independent. Although the circuit shown in FIG. 3b is a representation of Equation (11) without any approximation, it is not suitable for further manipulation because the series of capacitor $C'_c$ and inductor $L'_c$ brings some frequency dependent terms in deleting node i or node j in the subsequent steps. When Equation (11) for $g_{ij}$ is used in the next steps for deleting node i or j, the resultant combined branch admittance will not have the same simple format as that in Equation (9) any more. In order to derive a frequency independent circuit mode, some approximation needs to be done to simplify the third term of Equation (11):

$$g_{ij}^{(3)} = \frac{1}{j\varpi L'_e + 1/j\varpi C'_e} \quad (13)$$

$$= \frac{j\varpi C'_e}{1 - \varpi^2 L'_e C'_e}$$

$$= \frac{j\varpi C'_e}{1 - \varpi^2 L_i C_i}$$

If $\varpi^2 L_i C_i \ll 1$, $g_{ij}^{(3)} \approx \frac{j\varpi C'_e}{1 - \varpi_0^2 L_i C_i}$, where $$\varpi_0 = \sqrt{\sum_{n=1}^{N} \varpi_n^2 / N}$$

is chosen to minimize an average error in the given frequency range of interest, N is the number of frequency samples and $\varpi_n$ is the angular frequency of the nth frequency sample. This approximation means that a capacitor is used to replace the original LC serial resonator. This approximation is acceptable when the resonance frequency of the resonator is much higher than a cut-off frequency of interest.

Having had the approximation, Equation (12) will be rewritten as:

$$g_{ij} = j\varpi C''_e + 1/j\varpi L_e \quad (14)$$

where $C''_e = \frac{C_i C_j}{C_t} + \frac{\alpha L_t}{1 - \varpi_0^2 L_t C_t}$, $L_e = \frac{L_i L_j}{L_t}$ Here, we will describe how to determine whether or not a removable internal node exists in the internal nodes.

As stated above, it is understood by those skilled in the art that the approximation is relatively precise when $\overline{\varpi}^2 L_t C_t \ll 1$. Therefore, if an internal node of a coupling network satisfies the condition of $\overline{\varpi}^2 L_t C_t \ll 1$, this internal node can be removed, where $\overline{\varpi}^2 L_t C_t$ is referred to as a reference value.

Note that (14) combines the major influence of the removable node into those nodes that are immediately connected to the removable node.

The condition of $\overline{\varpi}^2 L_t C_t \ll 1$ means that the interaction between the capacitive and inductive couplings associated to an internal node is very weak over the frequency range of interest. For a coupling network generated from PEEC, most of the coupling capacitances and inductances are usually quite small. Therefore, the condition is true for most of the internal nodes for the frequencies in GHz range.

To show that the procedure described above can lead to a physically expressive circuit model, we take the coupling network in FIG. 1b as an example. At low frequencies, the current flowing through the inductors $L_{112}$, $L_{123}$ ($L_{112}$ means the inductor between node 101 and node 102) has almost the same value due to the small shunt capacitance of $C_{112}$, $C_{123}$ and $C_{124}$, where subscript 4 in $C_{112}$, $C_{123}$ and $C_{124}$, stands for a ground node. Because of this physical phenomenon, we can delete node 102 by combining the two inductors into one whose value equals to $L_{112}L_{123}/(L_{112}+L_{123})$ according to Equation (14).

The shunt capacitors of $C_{112}$, $C_{123}$ and $C_{124}$, will be combined to $C_{114}$, $C_{134}$ and $C_{113}$, with their values determined by Equation (14). At this stage, the number of meshes shown in FIG. 1a is reduced from 3 to 2. Nodes 1 and 3 will represent nodes with larger areas and their shunt capacitances to ground will increase. The increased capacitance and inductance associated with node 101 and node 103 may not satisfy the approximate condition at nodes 101 and 103. If it is the case, the nodes will be left in the ultimate equivalent circuit. Otherwise, the nodes will be deleted by the "combing- and-deducting" process.

It can be seen that this procedure retains the essential attribute at each local feature (node) and eliminates the insignificant effects associated with the local feature. The significant local attributes are then consolidated by a fewer more prominent circuit elements, which have clear physical meanings. For a complex 3-D multi-layer structure, the same node deduction procedure can be systematically applied to each internal node in a coupling network. The nodes that do not satisfy the approximate condition will be retained to form a final equivalent circuit model.

To implement the model order reduction procedure with a high degree of fidelity, two important aspects should be discussed:

(1) In a practical implementation, we can set a cut-off value δ for gauging every node by its reference value of $\overline{\varpi}_{max}^2 L_t C_t$ throughout an entire coupling network. It means that if a node satisfies $$\overline{\varpi}_{max}^2 L_t C_t < \delta \quad (15)$$

where $\omega_{max}$ is the highest angular frequency of interest, it will be considered as a removable node. The smaller the value δ is, the more nodes will be retained in a final equivalent circuit. In the present invention, the cut-off value δ is preferably set to be 0.15.

(2) Since the coupling network will be a dynamic network during the model order reduction iteration, one must select a judicious pattern for reducing the number of internal nodes. It is understood by those skilled in the art that by removing the most removable node, whose reference value of $\overline{\varpi}_{max}^2 L_t C_t$ is the least among all the remaining internal nodes, at each step of the iteration the process can retain the essential attribute of the network most. That is, we can first find out an internal node having the smallest reference value less than the predetermined cut-off value.

This is because the node with least $\overline{\omega}_{max}^2 L_t C_t$ corresponds to the least important pole of the original system. This point will be illustrated by an example in the next section.

The benefits of having a frequency independent and model order reduced circuit model are obvious. First, the circuit model reveals a clear correlation between the circuit mode and the physical circuit layout. The circuit model consists of not only the elements of major capacitance and inductance but also the components exhibiting the higher order parasitic couplings. Second, since the order of an original coupling network has been reduced significantly, and that the MOR process only needs to be done for few critical frequencies, the simulation expense will be reduced greatly even with the time for model order reduction is counted.

Next, the procedure of the method of the present invention for converting a multi-layer circuit into an equivalent circuit model will be described with reference to a flow chart illustrated in FIG. 16.

Figure 16:
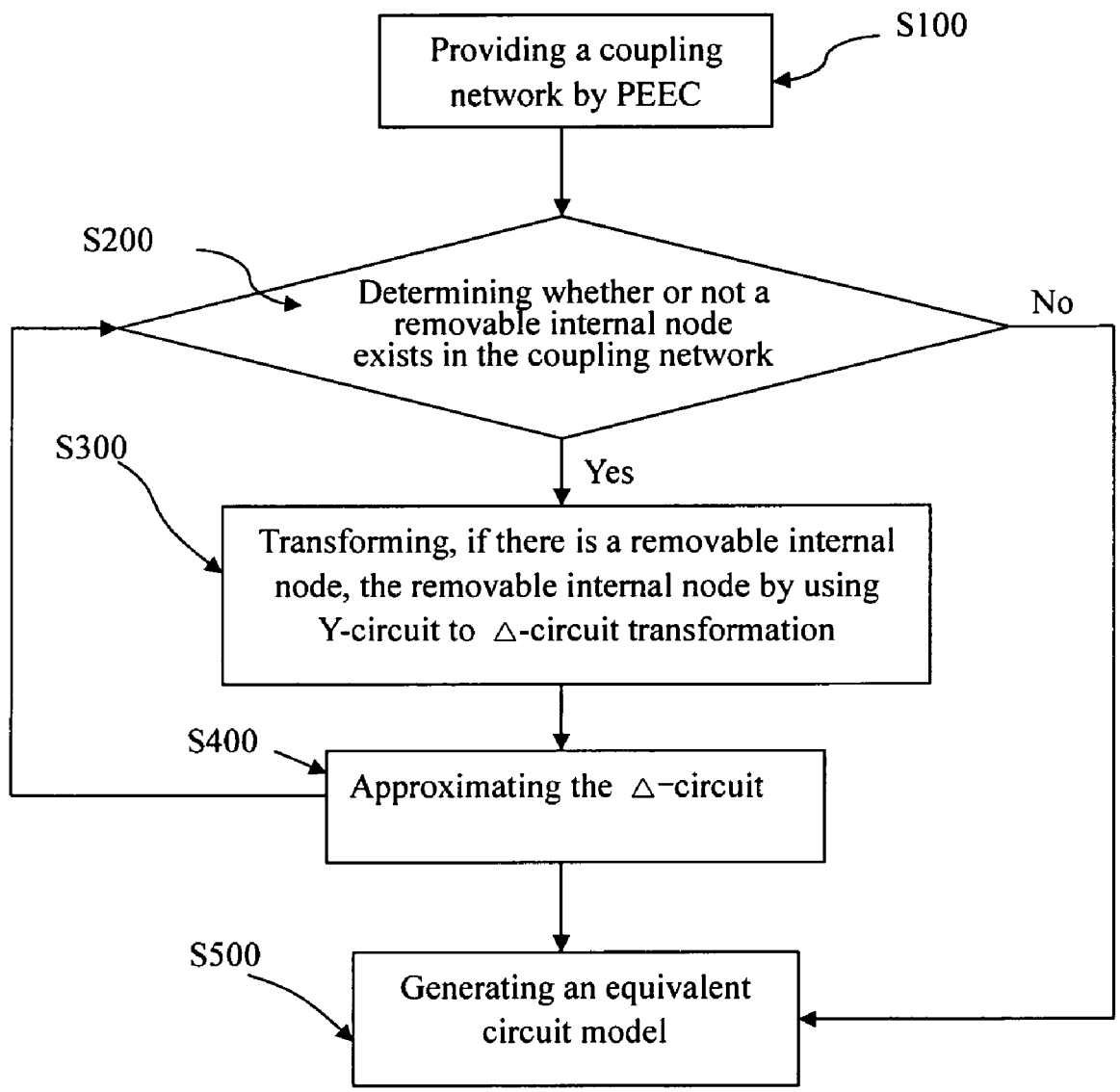
FIG. 16 is a flow chart illustrating a procedure of the method of the present invention.

As shown in FIG. 16, first, the flow chart begins with Step S100 for providing a coupling network by a PEEC model. Second, at Step S200, determining whether or not a removable internal node exists in the coupling network. If there exists a removable internal node, then transforming the removable internal node by using Y-circuit to Δ-circuit transformation at Step S300 is performed. At Step S400, the Δ-circuit is approximated and the flow chart will go back to Step S200. Otherwise if there does not exist a removable inter node in Step S200 then the flow chart will go to Step S500 for generating the equivalent circuit model.

Figure 17:
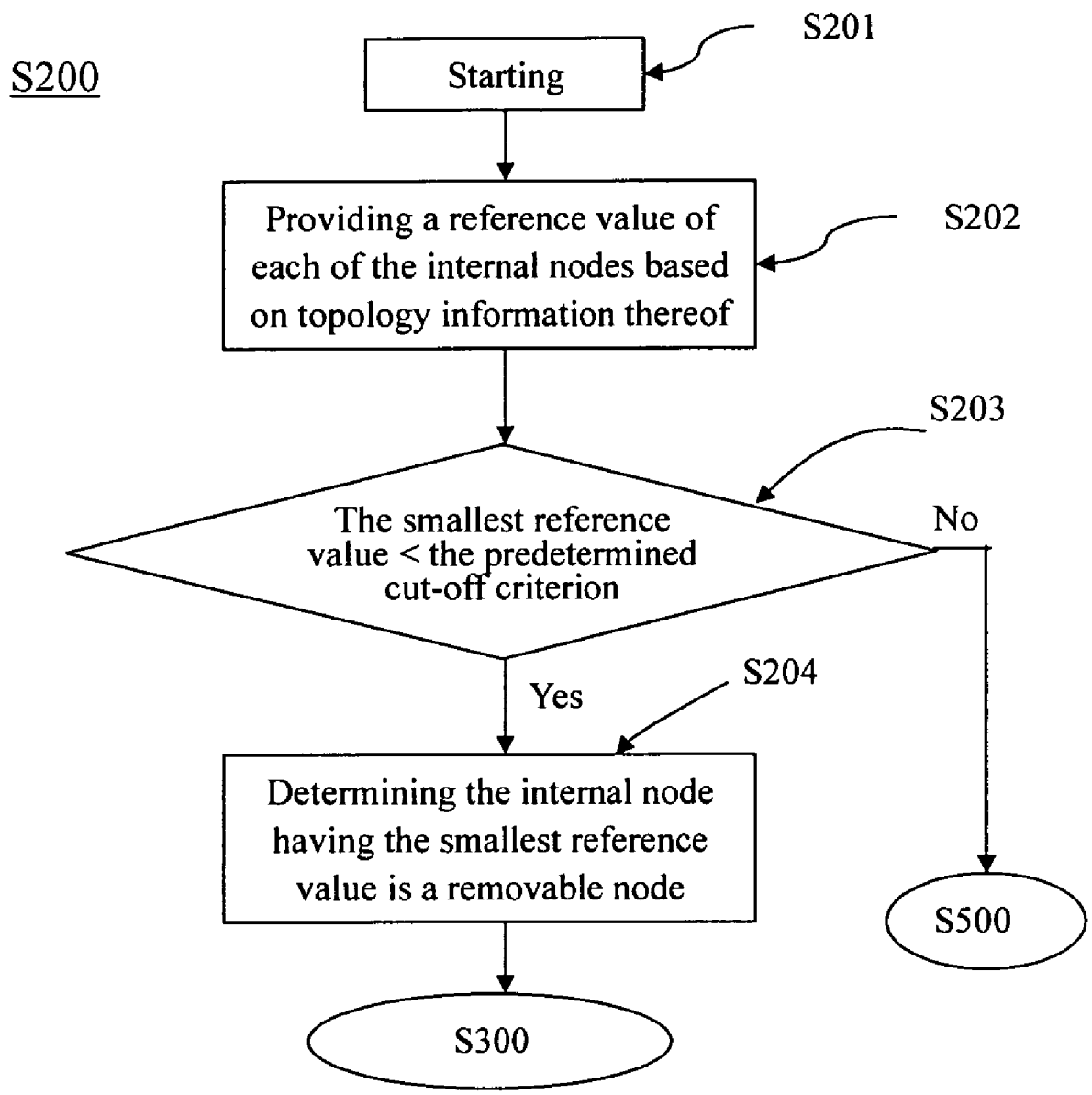
FIG. 17 is a flow chart illustrating a procedure of the Step S200 of the method as shown in FIG. 16.

The detailed procedure for implementing the Step S200 is illustrated in FIG. 17. When going to the Step S200 with the start procedure at Step S201, first a reference value of each of the internal nodes is provided based on topology information thereof at Step S202. Second, at Step S203, comparing the smallest reference value to the predetermined cut-off value is preformed, if the smallest reference value is smaller than the predetermined cut-off value then the flow chart will go to Step S204. Otherwise the flow chart will go to Step S500 for generating the equivalent circuit model. At Step S204, the internal node having the smallest reference value is determined as a removable node. The flow chart will then go to Step S300.

An apparatus for obtaining an equivalent circuit model of a multi-layer circuit according to one embodiment of the present invention comprises means for simulating the multi-layer circuit using an electromagnetic field analysis to provide a coupling network; and means for simplifying the coupling network using a circuit model order reduction method to generate the equivalent circuit model. In this embodiment, the means for providing a coupling network comprises a PEEC simulator. It will be understood by those skilled in the art that the means for simplifying the coupling network can be implemented by a software or a hardware such as an integrated circuit.

According to another embodiment of the present invention, an apparatus for obtaining an equivalent circuit model of a multi-layer circuit comprises a converter for converting a multi-layer circuit into a coupling network by using an electromagnetic field analysis; a memory for storing topology information representing the coupling network; and a processor for simplifying the coupling network based on the topology information to generate the equivalent circuit model.

In the following, four embodiments are given for demonstrating the present invention. The embodiments presented are typical embedded RF passives in an LTCC system on package modules. All of the full-wave EM simulation results are obtained by using either CST Microwave Studio (V.5.1.3) or Ansoft's HFSS version 8.

Embodiment 1

Figure 4:
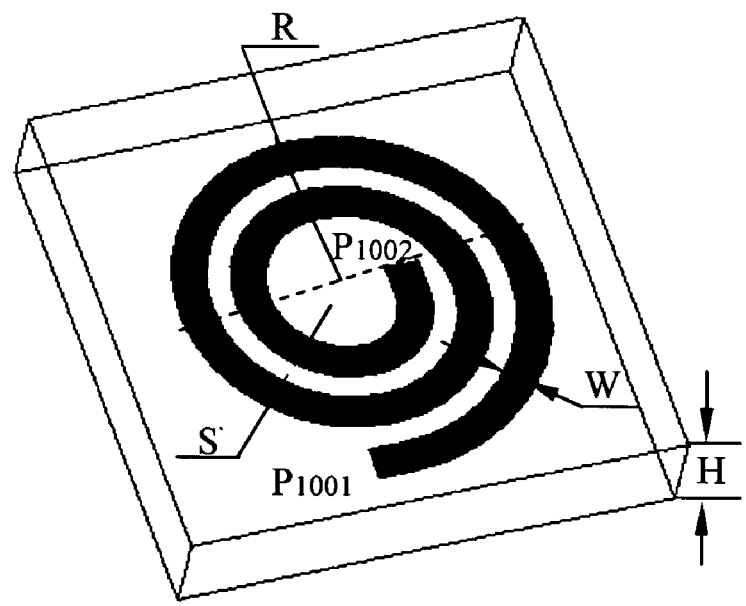
FIG. 4 shows a circular spiral inductor used in the invention.

This embodiment relates to a planar circular spiral inductor as illustrated in FIG. 4.

Figure 5A:
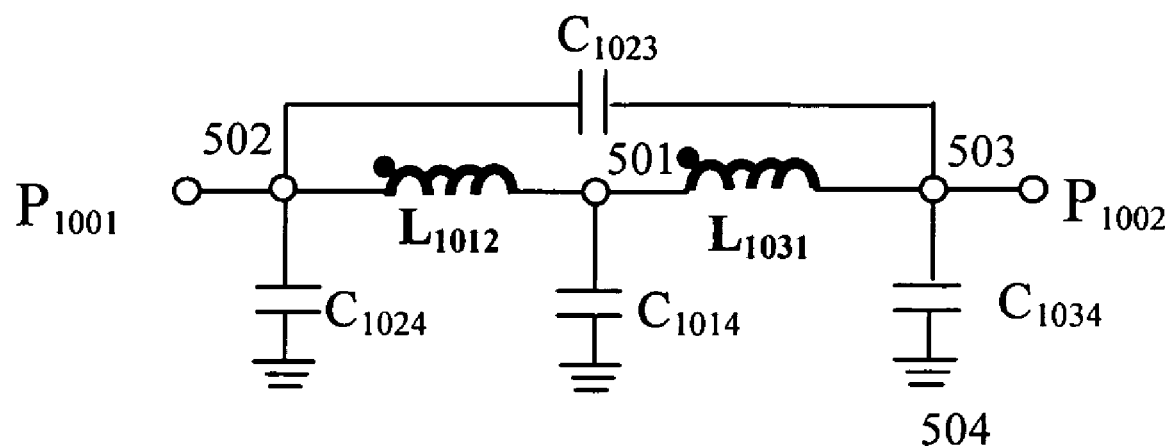
FIG. 5a shows an equivalent circuit of the circular spiral inductor as shown in FIG. 4.

The inductor is located at height of h in a grounded substrate whose height is H. The dimensions of the inductor are R=0.85, W=0.15, S=0.1, h=0.239 and H=0.437, all in mm. The dielectric constant of the substrate is 9.1. With the information of the multi-layer planar circular spiral inductor, the original coupling network having 16 internal nodes is generated from the PEEC model. After a model order reduction process as stated above, only one internal node is left. The corresponding derived lumped element circuit model is shown in FIG. 5a, the remaining coupling network comprises two external ports $P_{1001}$, $P_{1002}$ (external nodes 502, 503), a ground node 504, and an internal node 501. Moreover, the component values of the circuit model are $C_{1014}$=0.54 pF, $C_{1024}$=0.26 pF, $C_{1034}$=0.26 pF, $C_{1023}$=0.06 pF, $L_{1012}$=1.49 nH, $L_{1031}$=2.44 nH, and M=0.41 nH, where M is a mutual inductance between the $L_{1012}$ and $L_{1031}$.

The physical meaning of each component of the circuit model is obvious. The inductors $L_{1012}$ and $L_{1031}$ in this equivalent circuit model stands for the main partial inductance that we want to achieve and the capacitors $C_{1014}$, $C_{1024}$, $C_{1034}$, (4 is the ground node) are due to the parasite effects between the strip and the ground. Due to the shunt parasitic capacitor, this inductor is divided into two parts with the mutual inductive coupling M. The S-parameters of the two ports structure computed by the full-wave EM model and the DPECM are presented in FIG. 6. Good agreement can be observed.

Figure 5B:
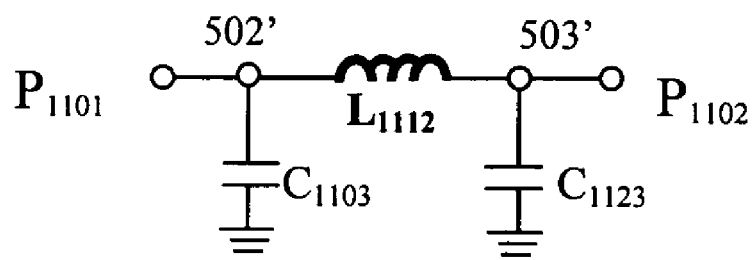
FIG. 5b shows an equivalent circuit of the circular spiral inductor as shown in FIG. 4.
Figure 6A:
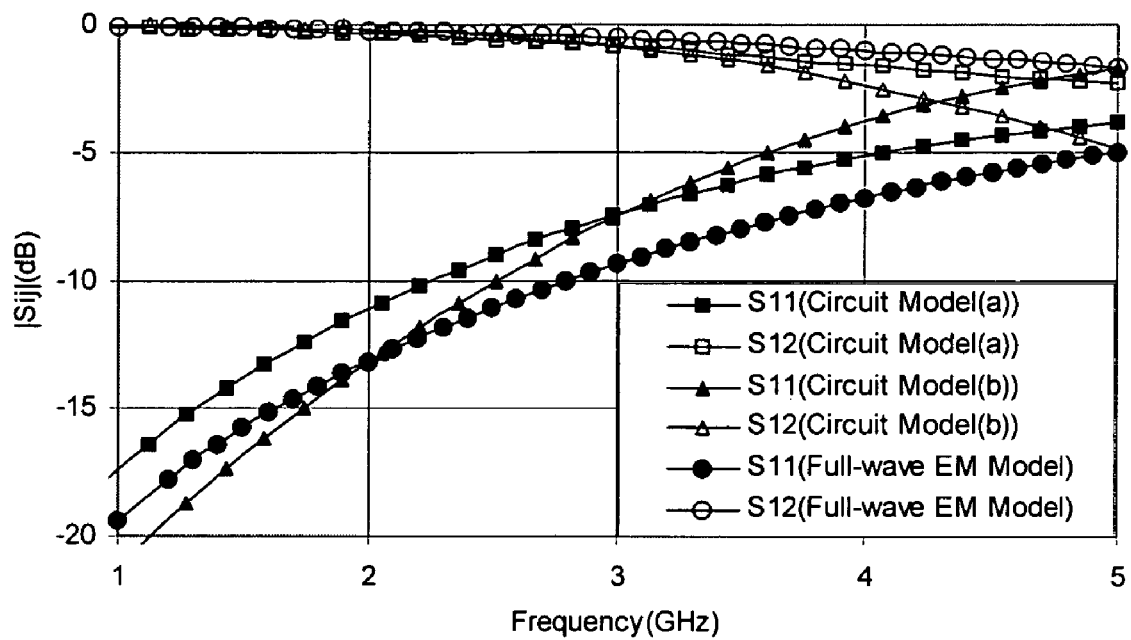
FIG. 6a shows S-parameters of magnitude of the derived equivalent circuits and full-wave EM model for the circular spiral inductor.
Figure 6B:
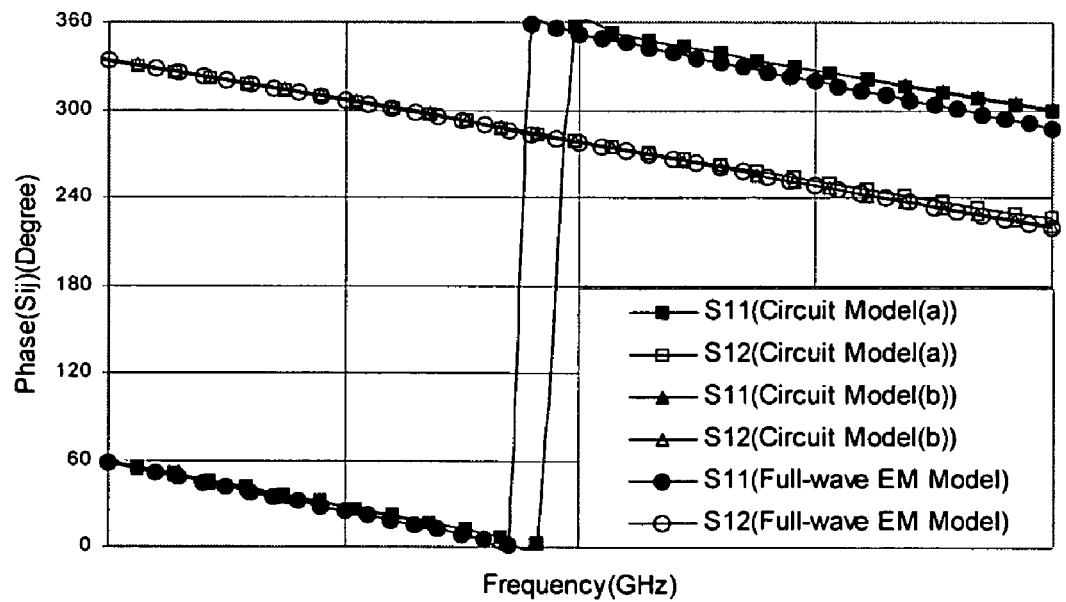
FIG. 6b shows S-parameters of phase of the derived equivalent circuits and full-wave EM model for the circular spiral inductor.

The equivalent circuit of this inductor can be further simplified into a model with only one inductor and two shunt parasitic capacitors if the accuracy is not the first priority. The simpler circuit model is shown in FIG. 5b and the corresponding S-parameters are superposed in FIG. 6. In this case, the cutoff value δ is set to 0.65, and thereby the node 501 is a removable node which can be absorbed by using the above mentioned Y-circuit to Δ-circuit transformation and the approximation of the Δ-circuit. And then, the remaining component values of the circuit model are $C_{1113}$=0.64 pF, $C_{1123}$=0.51 pF, and $L_{1112}$=4.10 nH. The S-parameters of the circuit models (a) and (b), as well as the full-wave EM model are shown in FIG. 6. It can be seen that circuit model (a) is more accurate than circuit model (b) as expected.

In order to mathematically justify the proposed model order reduction scheme presented in the paper, the system poles of the Y-matrix for this spiral inductor circuit can be found using the modified nodal analysis (MNA) method. The system poles of the Y-matrix after each internal removable node being removed are listed in FIG. 18. The first row in the table represents the number of internal nodes that have been removed. The columns list the corresponding system poles, in the order of descending of importance, that exist in pairs symmetric to the origin. Interestingly, from this table one can find that after each node is removed, the largest pole, i.e. the least important pole, is "absorbed" by other less significant poles.

Embodiment 2

Figure 7:
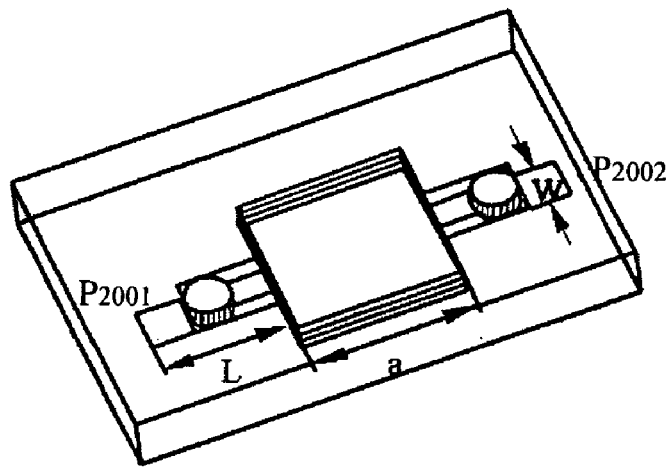
FIG. 7 shows a four-layer capacitor used in the invention.

This embodiment is directed to a four-layer capacitor that is embedded in a substrate with height of H=0.274 mm, as shown in FIG. 7.

The four square plates with heights of h1=0.091, h2=0.137, h3=0.182, h4=0.228 all in mm, have the same dimension of $\alpha \times \alpha$=0.762 mm×0.762 mm. The dimension of the input/output strip is L×W=0.254 mm×0.100 mm. The dielectric constant of the substrate is 7.8.

Figure 8:
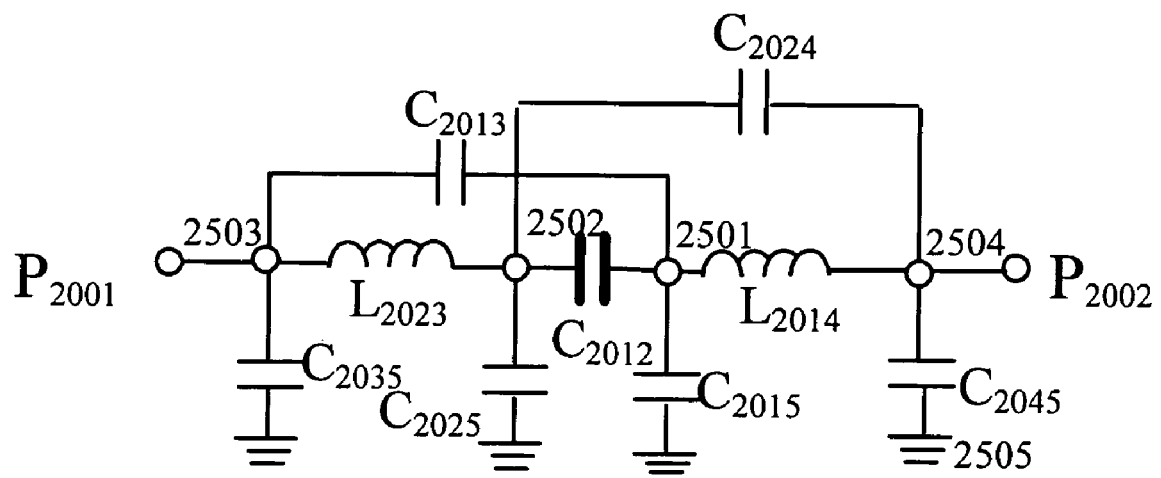
FIG. 8 shows a derived equivalent circuit of the four-layer capacitor as shown in FIG. 7.
Figure 9A:
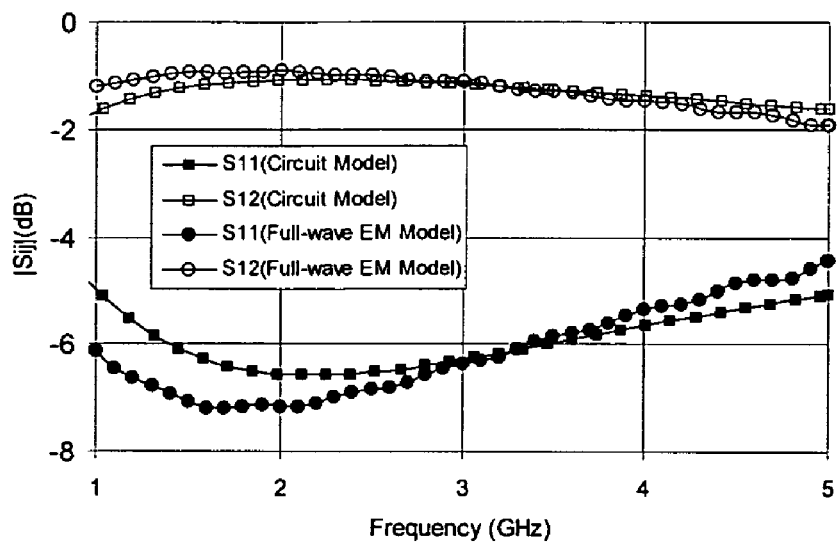
FIG. 9a shows S-parameters of magnitude of the derived equivalent circuit and full-wave EM model for the four-layer capacitor.
Figure 9B:
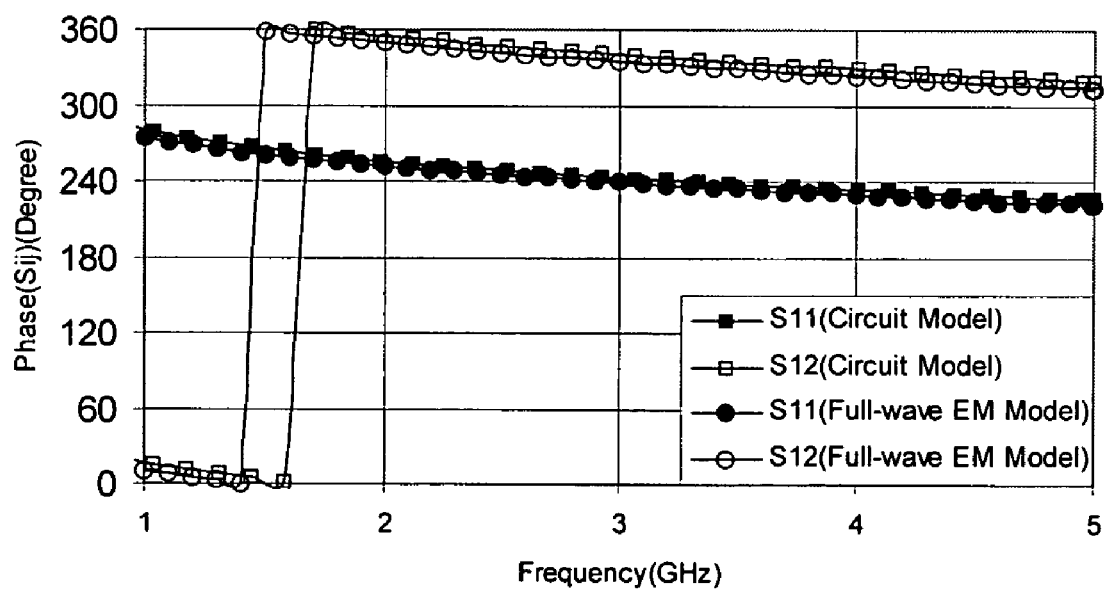
FIG. 9b shows S-parameters of phase of the derived equivalent circuit and full-wave EM model for the four-layer capacitor.

The equivalent circuit of this four-layer structure is derived as shown in FIG. 8, which comprises two external ports $P_{2001}$, $P_{2002}$ (external nodes 2503, 2504), a ground node 2505, and two internal node 2501, 2502. Moreover, the component values of the circuit model are $C_{2012}$=2.17 pF, $C_{2013}$=0.42 pF, $C_{2015}$=0.07pF, $C_{2024}$=0.29 pF, $C_{2025}$=0.35 pF, $C_{2035}$=0.40 pF, $C_{2045}$=0.15 pF, $L_{2014}$=0.31 nH, and $L_{2023}$=0.32 nH. In this circuit, node 2501 stands for the two plates connected by the via-hole from layer 1 to layer 3; node 2502 corresponds to the two plates in layer 2 and layer 3 that are also connected by a via-hole; node 2503 and node 2504 stand for the two ports and node 2505 is the ground node. Each component in this circuit has an obvious physical meaning associated to the original layout. The capacitor between node 2501 and node 2502 is the main capacitor of interest. The capacitors between nodes 2501, 2502, 2503, 2504 and node 2505 are introduced because of the parasite effects between the plates and the ground. The discontinuities between the input/output strips and the square plates lead to the two parasitic inductors $L_{2023}$ and $L_{2014}$ in the circuit model and capacitors $C_{2013}$ and $C_{2024}$ are parasitic capacitors. The S-parameters by the full-wave EM model and the derived equivalent circuit are shown in FIG. 9 and agreement is excellent.

Embodiment 3

Figure 10:
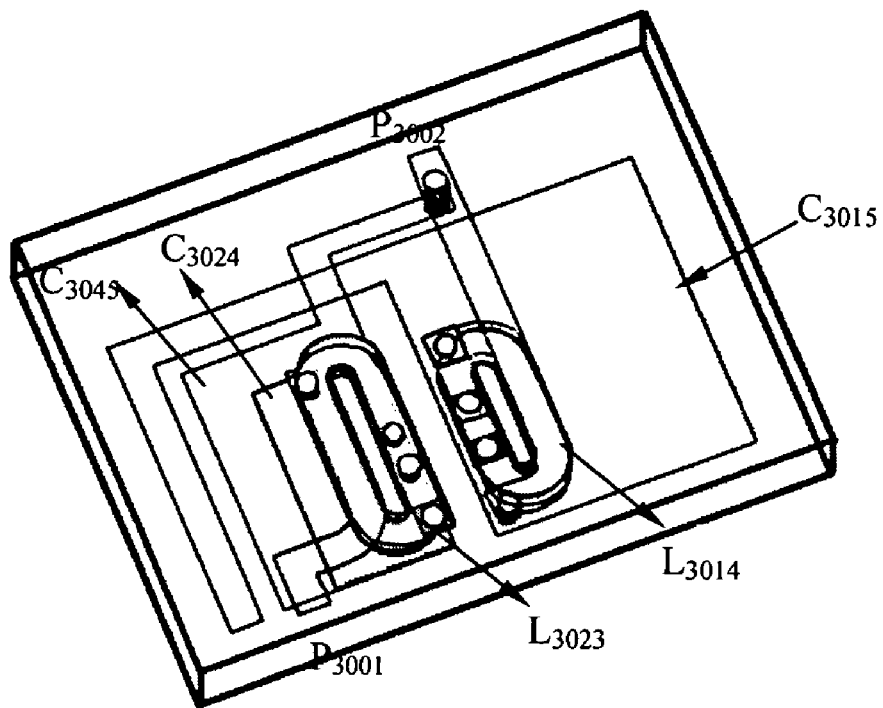
FIG. 10 shows a high-pass filter used in the invention.

This embodiment goes to a multi-layer high-pass filter as shown in FIG. 10.

Figure 11:
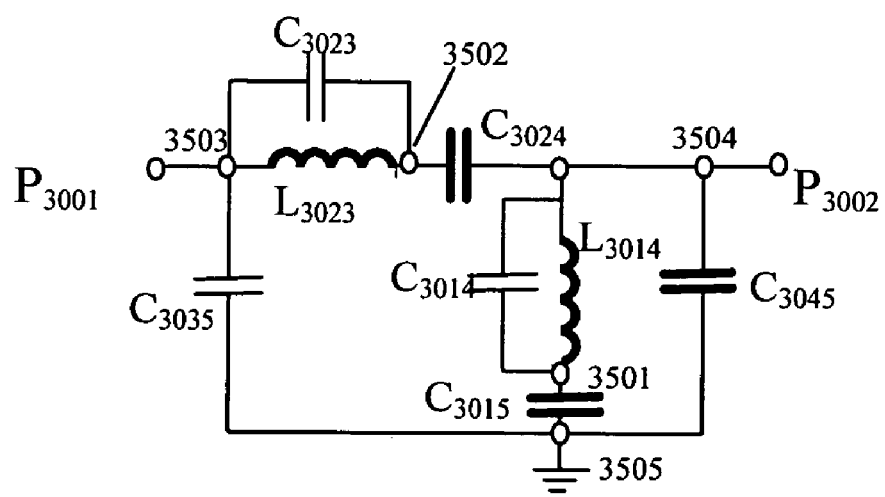
FIG. 11 shows a derived equivalent circuit of the high-pass filter as shown in FIG. 10.
Figure 12:
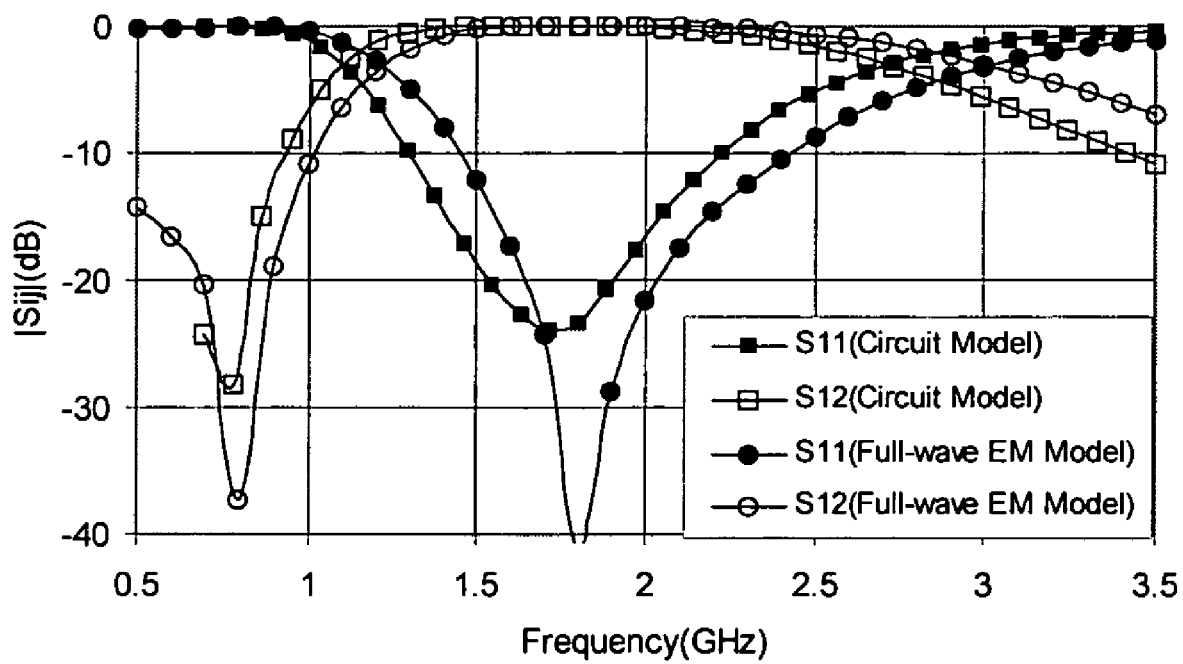
FIG. 12 S-parameters of the equivalent circuit and the full-wave EM model for the high-pass filter.

The filter is constructed by an 8-layer substrate with dielectric constant of 9.1 and the thinnest tape thickness of 0.041 mm. The thickness of the conductor is 0.01 mm. In other words, the metallization thickness is about one fourth of the thinnest dielectric thickness. In order to accurately model this filter whose metallization thickness cannot be neglected, a novel PEEC algorithm without increasing the number of PEEC circuit elements is applied for generating the coupling network. The proposed DPECM is then used to derive the equivalent circuit, which is depicted in FIG. 11. The equivalent circuit comprises two external ports $P_{3001}$, $P_{3002}$ (external nodes 3503, 3504), a ground node 3505, and two internal node 3501, 3502. Note that $L_{3023}$, $L_{3014}$, $C_{3024}$, $C_{3045}$ and $C_{3015}$ are the main elements of the original high-pass filter schematic and $C_{3023}$, $C_{3014}$, $C_{3035}$ and $C_{3045}$ are parasitic elements. The component values are $C_{3014}$=0.15 pF, $C_{3015}$=5.08 pF, $C_{3023}$=0.11 pF, $C_{3024}$=1.58 pF, $C_{3035}$=0.08 pF, $C_{3045}$=1.68 pF, $L_{3014}$=5.29 nH, and $L_{23}$=5.39 nH.

Figure 13:
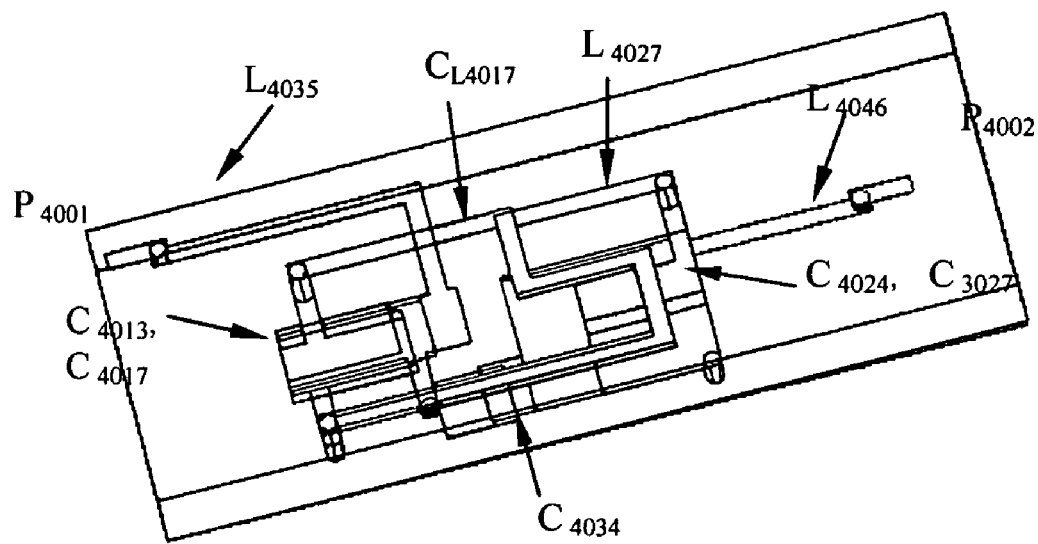
FIG. 13 shows a band-pass filter used in the invention.

The S-parameters of the equivalent circuit and the full wave EM simulation are superposed in FIG. 13 and good agreement can also be observed. The time for DPECM is about 10 seconds while the time for the full-wave EM simulation is about 1,200 seconds.

Embodiment 4

This embodiment is directed to a multi-layer band-pass filter as shown in FIG. 13.

Figure 14:
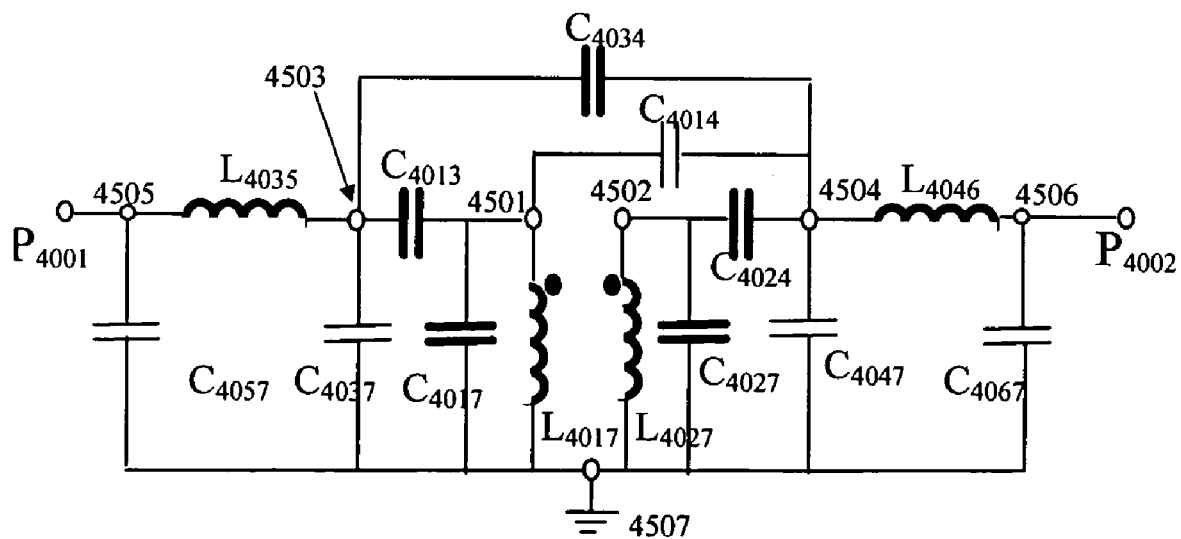
FIG. 14 shows a derived equivalent circuit of the band-pass filter as shown in FIG. 13.
Figure 15:
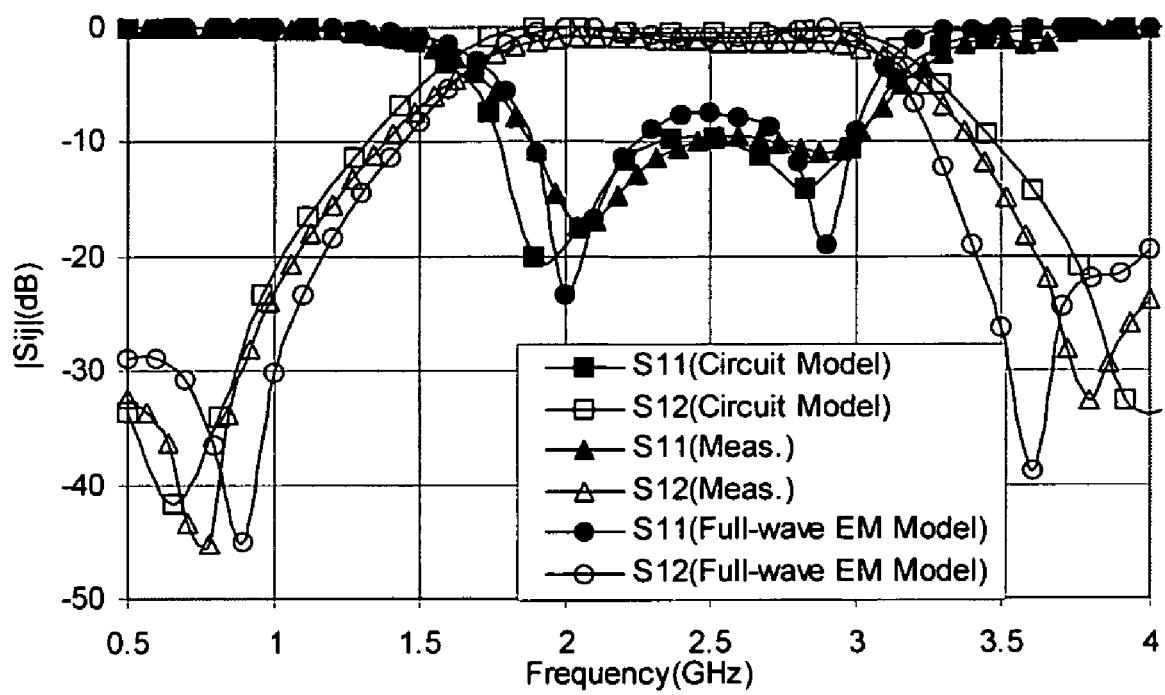
FIG. 15 shows S-parameters of the equivalent circuit, measurement and the full-wave EM model for the band-pass filter.

The filter is constructed by a 7-layer substrate with dielectric constant of 7.8 and the thinnest tape thickness of 0.043 mm. The thickness of the conductor is 0.01 mm. The derived equivalent circuit of this band-pass filter is shown in FIG. 14. The equivalent circuit comprises two external ports $P_{4001}$, $P_{3002}$ (external nodes 4505, 4506), a ground node 4507, and four internal node 2501, 2502, 2503, 2504. Note that $L_{4017}$, $L_{4027}$, $L_{4035}$, $L_{4046}$, $C_{4013}$, $C_{4017}$, $C_{4024}$, $C_{4027}$, $C_{4034}$ are the main components of the original band-pass filter schematic and others are parasitic elements $C_{4013}$=1.28 pF, $C_{4014}$=0.17 pF, $C_{4017}$=1.21 pF, $C_{4024}$=2.65 pF, $C_{4027}$=1.23 pF, $C_{4034}$=0.13 pF, $C_{4037}$=0.37 pF, $C_{4047}$=0.55 pF, $C_{4057}$=0.19 pF, $C_{4067}$=0.11 pF, $L_{4035}$=1.34 nH, $L_{4046}$=0.64 nH, $L_{4027}$=2.18 nH, $L_{4017}$=2.47 nH, and Mul=1.00 nH. This band-pass filter has been built using LTCC technology. The S-parameters of the equivalent circuit and the measured as well as the full-wave EM model are superposed in FIG. 15. Good agreement can also be observed. It is worthy to mention that the time for creating DPECM and simulation is about 7 seconds whereas the time for the full-wave EM simulation is about 280 seconds.

A novel method for providing derived physically expressive circuit models representing embedded RF passives is presented herein. The method is based on the quasi-static PEEC model and a simple systematic model order reduction scheme. The circuit model has been proven to be effective and robust in deriving a physically expressive equivalent circuit of a 3-D multi-layer RF passive circuit without any physical intuition and prior knowledge. Since the computation time for deriving the circuit model and generating the S-parameters over a wide frequency band of interest is a few orders of magnitude faster than a typical full-wave electromagnetic simulator, the proposed scheme can be used as a real time design library for embedded RF passives.

Four embodiments have been provided to illustrate the details and the effectiveness of the model. Because each component in the equivalent circuit obviously relates to a part of the original layout, one can physically adjust the dimension of the structure in order to achieve the desired values of the components of interest when designing an embedded RF circuit. The equivalent circuit model can be extended to the cases where the substrate loss and conductor loss are considered. For high frequency applications, a full wave Green's function for layered media should be used to accommodate the radiation loss.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

REFERENCES

[1] A Sutono, D. Heo, Y.-J. E. Chen and J. Laskar, "High-Q LTCC basedpassive library for wireless system-on-package (SOP) module development," *IEEE Trans. Microwave Theory Tech.*, vol. 49, no. 10, pp. 1715-1724, October 2001.

[2] K. Rambabu and J. Bornemann, "Simplified analysis technique for the initial design of LTCC filters with all-capacitive coupling", *IEEE Trans. Microwave Theory Tech.*, vol. 53, no. 5, pp. 1787-1791, 2005.

[3] K. Lim, et al, "RF-system-on-package (SOP) for wireless communications", *IEEE Microwave Magazine*, Vol. 3, No. 1, pp. 88-99, March 2002.

[4] P. L. Werner, R. Mittra, D. H. Werner, "Extraction of SPICE-type equivalent circuits of microwave components and discontinuities using the genetic algorithm optimization technique," *IEEE Trans. Components, Packaging and Manuf. Technol.*, Part B: Advanced Packaging, vol. 23, pp. 55-61, 2000.

[5] Ian Timmins and K.-L. Wu, "An Efficient Systematic Approach to Model Extraction for Passive Microwave Circuits", *IEEE Trans. Microwave Theory Tech.*, vol. 48, no. 9, pp. 1565-1573, September 2000.

[6] A. E. Ruehli, "Equivalent circuit models for three-dimensional multi-conductor systems", *IEEE Trans. Microwave Theory Tech.*, vol. 22, no. 3, pp. 216-221, March 1974.

[7] Hansruedi Heeb, A. E. Ruehli, "Three-Dimensional Interconnect Analysis Using Partial Element Equivalent Circuits", *IEEE Trans. Circuits and Systems—I: Fundamental Theory and Applications*, vol. 39, no. 11, pp. 974-982, November 1992.

[8] Altan Odabasioglu, Mustafa Celik, Lawrence T. Plieggi, "PRIMA: Passive Reduced-Order Internnect Macromodeling Algorithm", *IEEE Trans. Computer-Aided Design of Integrated Circuits and Systems*, Vol. 17, No. 8, pp. 645-654, August 1998.

[9] K.-L. Wu, Y.-J. Zhao, J. Wang and M. K. K. Cheng, "An Effective Dynamic Coarse Model for Optimization Design of LTCC RF Circuits With Aggressive Space Mapping", *IEEE Trans. Microwave Theory Tech.*, vol. 52, no. 1, pp. 393-402, January 2004.

[10] J. W. Bandler, R. M. Biernacki, S. H. Chen, R. H. Hemmers, and K. Madsen, "Electromagnetic optimization exploiting aggressive space mapping," *IEEE Trans. Microwave Theory Tech.*, vol. 43, pp. 2874-2882, December 1995.

[11] K.-L. Wu, L. K. Yeung, Y. Ding, "An efficient PEEC algorithm for modeling of LTCC RF circuits with finite metal strip thickness", *IEEE Microwave and Wireless Components Letters*, vol. 13, no. 9, pp. 390-392, September, 2003.

The invention claimed is:

1. A method for obtaining an equivalent circuit model of a multi-layer circuit, comprising
simulating the multi-layer circuit using an electromagnetic field analysis to provide a coupling network including one or more internal nodes and one or more external nodes; and
simplifying, via a processor, the coupling network by removing one or more removable nodes from the coupling network iteratively to generate the equivalent circuit model, wherein the removable nodes are nodes among the internal nodes of the coupling network, each of which includes a reference value lower than a predetermined cut-off value,
wherein the reference value of a node of the internal nodes is defined as $$|\omega_{max}^2 L_t C_t|$$

where $\omega_{max}$ is the highest angular frequency of interest, $| \ |$ refers to absolute value, and
$L_t, C_t,$ are the total inductance and capacitance connected to the node, respectively.

2. The method of claim 1, wherein the electromagnetic field analysis includes a PEEC modeling.

3. The method of claim 1, wherein said simplifying comprises
absorbing one node from the removable nodes by using Y-circuit to Δ-circuit transformation;
approximating the Δ-circuit to update coupling network; and
repeating said absorbing until there is no removable node existing in the updated coupling network, in which the updated coupling network without the removable nodes is the equivalent circuit model.

4. The method of claim 1, wherein the predetermined cut-off value is a constant between 0 and 1.

5. The method of claim 1, wherein the constant is 0.15.

6. The method of claim 3, wherein said one node to be absorbed is coupled to m nodes from node 1 to node m in the coupling network, said Y-circuit to Δ-circuit transformation is realized by using the following equation:

$$g_{ij} = \frac{g_i g_j}{g_t} \quad i, j = 1, 2, \ldots, m$$

where $$g_i = j\varpi C_i + \frac{1}{j\varpi L_i}$$

$$g_t = g_1 + g_2 + \cdots g_m$$

$$g_{ij} = \frac{(j\varpi C_i + 1/j\varpi L_i)(j\varpi C_j + 1/j\varpi L_j)}{j\varpi C_t + 1/j\varpi L_t}$$

$$g_{ij} = j\varpi C_e + \frac{1}{j\varpi L_e} + \frac{1}{j\varpi L'_e + 1/j\varpi C'_e} \quad \text{where}$$

$$C_e = \frac{C_i C_j}{C_t}, \ L_e = \frac{L_i L_j}{L_t}, \ L'_e = \frac{C_t}{\alpha}, \ C'_e = L_t \alpha$$

$$\alpha = \frac{C_i}{L_j} + \frac{C_j}{L_i} - \frac{C_i C_j}{L_t C_t} - \frac{L_t C_t}{L_i L_j}$$

in which, m is a positive integer,
Li, Ci are the inductance and capacitance between the node i and said one node, respectively,
$L_t, C_t,$ are the total inductance and capacitance connected to the node, respectively,
$g_i$ represents an admittance between the node i and said one node, and $g_{ij}$ represents an admittance between the node i and the node j after absorbing said one node.

7. A method for obtaining an equivalent circuit model of a multi-layer circuit, comprising
simulating the multi-layer circuit using an electromagnetic field analysis to provide a coupling network including one or more internal nodes and one or more external nodes; and
simplifying, via a processor, the coupling network by removing one or more removable nodes from the coupling network iteratively to generate the equivalent circuit model, wherein the removable nodes are nodes among the internal nodes of the coupling network, each of which includes a reference value lower than a predetermined cut-off value,
wherein said simplifying comprises
absorbing one node from the removable nodes by using Y-circuit to Δ-circuit transformation;
approximating Δ-circuit to update coupling network; and repeating said absorbing until there is no removable node existing in the updated coupling network, in which the updated coupling network without the removable nodes is the equivalent circuit model, wherein said one node to be absorbed is coupled to m nodes from node 1 to node m in the coupling network, said Y-circuit to Δ-circuit transformation is realized by using the following equation:

$$g_{ij} = \frac{g_i g_j}{g_t} \quad i, j = 1, 2, \ldots, m \text{ where}$$

$$g_i = j\varpi C_i + \frac{1}{j\varpi L_i}$$

$$g_t = g_1 + g_2 + \ldots g_m$$

$$g_{ij} = \frac{(j\varpi C_i + 1/j\varpi L_i)(j\varpi C_j + 1/j\varpi L_j)}{j\varpi C_t + 1/j\varpi L_t}$$

$$g_{ij} = j\varpi C_e + \frac{1}{j\varpi L_e} + \frac{1}{j\varpi L'_e + 1/j\varpi C'_e}$$

$$C_e = \frac{C_i C_j}{C_t}, \; L_e = \frac{L_i L_j}{L_t}, \; L'_e = \frac{C_t}{\alpha}, \; C'_e = L_t \alpha$$

$$\alpha = \frac{C_i}{L_j} + \frac{C_j}{L_i} - \frac{C_i C_j}{L_t C_t} - \frac{L_t C_t}{L_i L_j}$$

wherein said approximating the Δ-circuit is implemented by the following equation:

$$g_{ij} = j\varpi C''_e + 1/j\varpi L_e$$

where $$C''_e = \frac{C_i C_j}{C_t} + \frac{\alpha L_t}{1 - \varpi_0^2 L_t C_t}, \quad L_e = \frac{L_i L_j}{L_t},$$

$$\alpha = \frac{C_i}{L_j} + \frac{C_j}{L_i} - \frac{C_i C_j}{L_t C_t} - \frac{L_t C_t}{L_i L_j}, \quad \varpi_0 = \sqrt{\sum_{n=1}^{N} \varpi_n^2 / N}$$

in which, m is a positive integer,

Li, Ci are the inductance and capacitance between the node i and said one node, respectively, $L_t, C_t$, are the total inductance and capacitance connected to the node, respectively, $g_i$ represents an admittance between the node i and said one node, $g_{ij}$ represents an admittance between the node i and the node j after absorbing said one node, and N is the number of frequency samples and $\omega_n$ is the angular frequency of the nth frequency sample.

8. The method of claim 7, wherein the Ct and Lt are complex numbers when the coupling network is a lossy coupling network.

9. The method of claim 1, wherein the multi-layer circuit comprises a multi-layer embedded RF passive, or a circuit layout.

10. The method of claim 9, wherein the multi-layer embedded RF passive comprises a multi-layer spiral inductor, a multi-layer capacitor, a multi-layer high-pass filter, or a multi-layer band-pass filter.

11. An apparatus for obtaining an equivalent circuit model of a multi-layer circuit, comprising a simulator for simulating the multi-layer circuit using an electromagnetic field analysis to provide a coupling network including one or more internal nodes and one or more external nodes; and a processor for simplifying the coupling network by removing one or more removable nodes from the coupling network iteratively to generate the equivalent circuit model, wherein the removable nodes are nodes among the internal nodes of the coupling network, each of which includes a reference value lower than a predetermined cut-off value, wherein the reference value of a node of the internal nodes is defined as $$\downarrow \varpi_{max}^2 L_t C_t \downarrow$$

where $\omega_{max}$ is the highest angular frequency of interest, | | refers to absolute value, and $L_t, C_t$, are the total inductance and capacitance connected to the node, respectively.

12. The apparatus of claim 11, wherein said simulator comprises a PEEC simulator.

13. The apparatus of claim 11, wherein said processor for simplifying the coupling network comprises an integrated circuit.

14. The apparatus of claim 12, wherein said processor for simplifying the coupling network comprises circuit for absorbing one node from the removable nodes by using Y-circuit to Δ-circuit transformation;

circuit for approximating the Δ-circuit to update coupling network; and circuit for repeating said absorbing until there is no removable node existing in the updated coupling network, in which the updated coupling network without the removable nodes is the equivalent circuit model.

15. An apparatus for obtaining an equivalent circuit model of a multi-layer circuit, comprising a converter for converting a multi-layer circuit into a coupling network including one or more internal nodes and one or more external nodes by using an electromagnetic field analysis; and a processor for simplifying the coupling network by removing one or more removable nodes from the coupling network iteratively to generate the equivalent circuit model, wherein the removable nodes are nodes among the internal nodes of the coupling network, each of which includes a reference value lower than a predetermined cut-off value, wherein said processor for simplifying the coupling network comprises;

a circuit for absorbing one node from the removable nodes by using Y-circuit to Δ-circuit transformation;

a circuit for approximating Δ-circuit to update coupling network; and a circuit for repeating said absorbing until there is no removable node existing in the updated coupling network, in which the updated coupling network without the removable nodes is the equivalent circuit model;

wherein said one node to be absorbed is coupled to m nodes from node 1 to node m in the coupling network, said Y-circuit to Δ-circuit transformation is realized by using the following equation:

$$g_{ij} = \frac{g_i g_j}{g_t} \quad i, j = 1, 2, \ldots, m \text{ where}$$

$$g_i = j\varpi C_i + \frac{1}{j\varpi L_i}$$

-continued $$g_t = g_1 + g_2 + \ldots g_m$$

$$g_{ij} = \frac{(j\bar{\omega}C_i + 1/j\bar{\omega}L_i)(j\bar{\omega}C_j + 1/j\bar{\omega}L_j)}{j\bar{\omega}C_t + 1/j\bar{\omega}L_t}$$

$$g_{ij} = j\bar{\omega}C_e + \frac{1}{j\bar{\omega}L_e} + \frac{1}{j\bar{\omega}L'_e + 1/j\bar{\omega}C'_e}$$

$$C_e = \frac{C_i C_j}{C_t}, \quad L_e = \frac{L_i L_j}{L_t}, \quad L'_e = \frac{C_t}{\alpha}, \quad C'_e = L_t \alpha$$

$$\alpha = \frac{C_i}{L_j} + \frac{C_j}{L_i} - \frac{C_i C_j}{L_t C_t} - \frac{L_t C_t}{L_i L_j}$$

wherein said approximating the Δ-circuit is implemented by the following equation:

$$g_{ij} = j\bar{\omega}C''_e + 1/j\bar{\omega}L_e \text{ where}$$

$$C''_e = \frac{C_i C_j}{C_t} + \frac{\alpha L_t}{1 - \bar{\omega}_0^2 L_t C_t},$$

$$L_e = \frac{L_i L_j}{L_t},$$

$$\alpha = \frac{C_i}{L_j} + \frac{C_j}{L_i} - \frac{C_i C_j}{L_t C_t} - \frac{L_t C_t}{L_i L_j},$$

$$\bar{\omega}_0 = \sqrt{\sum_{n=1}^{N} \bar{\omega}_n^2 / N}$$

in which, m is a positive integer,
Li, Ci are the inductance and capacitance between the node i and said one node, respectively,
$L_t, C_t$ are the total inductance and capacitance connected to the node, respectively,
$g_i$ represents an admittance between the node i and said one node,
$g_{ij}$ represents an admittance between the node i and the node j after absorbing said one node, and
N is the number of frequency samples and $\omega_n$ is the angular frequency of the nth frequency sample.

16. The apparatus of claim 15, wherein the converter comprises a PEEC model simulator.

17. The apparatus of claim 15, wherein the multi-layer circuit comprises a multi-layer embedded RF passive, or a circuit layout.

18. The method of claim 17, wherein the multi-layer embedded RF passive comprises a multi-layer spiral inductor, a multi-layer capacitor, a multi-layer high-pass filter, or a multi-layer band-pass filter.

19. The method of claim 3, wherein said simplifying further comprises updating the removable nodes based on the updated coupling network prior to said repeating.

20. The method of claim 19, wherein said one node to be absorbed is configured to be a node having the smallest reference value among the removable nodes of the updated coupling model.

21. The method of claim 1 wherein the reference value to each of the internal nodes is provided based on topology information of the coupling network.

22. The method of claim 1, wherein said simplifying comprises
absorbing one node from the removable nodes by using Y-circuit to Δ-circuit transformation to update coupling network; and
repeating said absorbing until there is no removable node existing in the updated coupling network, in which the updated coupling network without the removable nodes is the equivalent circuit model.

23. The method of claim 6, wherein said approximating the Δ-circuit is implemented by the following equation:

$$g_{ij} = j\bar{\omega}C''_e + 1/j\bar{\omega}L_e \text{ where}$$

$$C''_e = \frac{C_i C_j}{C_t} + \frac{\alpha L_t}{1 - \bar{\omega}_0^2 L_t C_t},$$

$$L_e = \frac{L_i L_j}{L_t},$$

$$\alpha = \frac{C_i}{L_j} + \frac{C_j}{L_i} - \frac{C_i C_j}{L_t C_t} - \frac{L_t C_t}{L_i L_j},$$

$$\bar{\omega}_0 = \sqrt{\sum_{n=1}^{N} \bar{\omega}_n^2 / N}$$

where N is the number of frequency samples and $\omega_n$ is the angular frequency of the nth frequency sample.

24. The method of claim 7, wherein the reference value of a node of the internal nodes is defined as $$|\bar{\omega}_{max}^2 L_t C_t|$$

where $\omega_{max}$ is the highest angular frequency of interest, | | refers to absolute value, and
$L_t, C_t$ are the total inductance and capacitance connected to the node, respectively.

* * * * *